(12) United States Patent
Yu

(10) Patent No.: US 6,373,912 B1
(45) Date of Patent: *Apr. 16, 2002

(54) PHASE-LOCKED LOOP ARRANGEMENT WITH FAST LOCK MODE

(75) Inventor: Wing Kong Yu, Austin, TX (US)

(73) Assignee: Legerity, Inc., Austin, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/876,816

(22) Filed: Jun. 16, 1997

(51) Int. Cl.[7] .............................. H04D 3/24; H03K 3/16; H03B 5/30
(52) U.S. Cl. ..................... 375/376; 327/147; 327/156
(58) Field of Search ................................ 375/376, 374, 375/375, 294; 331/11, 1 A, 18, 14; 327/156, 157, 155, 160, 147

(56) References Cited

U.S. PATENT DOCUMENTS

| | | | | | |
|---|---|---|---|---|---|
| 4,225,828 A | * | 9/1980 | Watanabe et al. | ............ | 331/1 A |
| 5,079,520 A | * | 1/1992 | Rapeli | ................ | 331/1 A |
| 5,113,152 A | * | 5/1992 | Norimatsu | ................ | 331/11 |
| 5,220,684 A | * | 6/1993 | Suizu | ................ | 455/184.1 |
| 5,334,952 A | * | 8/1994 | Maddy et al. | ................ | 331/14 |
| 5,610,955 A | * | 3/1997 | Bland | ................ | 375/376 |
| 5,635,875 A | * | 6/1997 | Kusakabe | ................ | 331/1 A |
| 5,774,511 A | * | 6/1998 | Boerstler | ................ | 375/376 |
| 5,783,972 A | * | 7/1998 | Nishikawa | ................ | 331/17 |

* cited by examiner

*Primary Examiner*—Chi Pham
*Assistant Examiner*—Khai Tran
(74) *Attorney, Agent, or Firm*—Williams, Morgan & Amerson

(57) ABSTRACT

The present invention is directed to a method and arrangement for phase-locking to an incoming signal using a fast-acting start-up mode followed by a second steady-state mode of operation. The method includes providing a reference signal by dividing the incoming signal by m during a phase-lock initiation stage and by dividing by n thereafter, providing an output signal having a frequency that is synchronized to the incoming signal when the arrangement is phase-locked to the incoming signal, and providing a feedback signal by dividing the output signal by x during a phase-lock initiation stage and by dividing by y thereafter. A phase difference between the feedback and reference signals is detected and the frequency-controllable oscillator is controlled, so that the frequency of the output signal is synchronized to the incoming signal.

9 Claims, 3 Drawing Sheets

PHASE-LOCKED LOOP ARRANGEMENT WITH FAST LOCK MODE

FIELD OF THE INVENTION

The present invention relates generally to digital control and communication arrangements. More particularly, the present invention relates to digital control arrangements used in connection with communication systems having phase-locked loop circuits.

BACKGROUND OF THE INVENTION

Phase-locked loops have become an important part of many communication systems. Phase-locked loops, sometimes referred to as PLLs, are used to synchronize signals used in the communication so that information is not lost. One basic phase-locked loop consists of a signal frequency divider, a phase detector, a low-pass filter, and a voltage-controlled oscillator. The voltage-controlled oscillator, or VCO, generates an output frequency signal that is synchronized to the input signal when the circuit is phase-locked.

Operation of such a conventional phase-locked loop, when the frequency generated by the voltage-controlled oscillator is near at multiple of the incoming frequency, is as follows. The incoming signal is compared with the feedback from the output of the voltage-controlled oscillator. The phase detector detects a phase difference, generally as a voltage whose magnitude and sign are proportional to the phase difference. This voltage is used to control the voltage-controlled oscillator in such a way that the phase-locked loop attempts to keep the phase difference between the output signal and the incoming signal as close to zero as possible.

There are many variations to the above approach and implementation details often depend on the particular application or communication system specifications. For example, a technique commonly found in frequency synthesizers is to use a divide-by-n circuit following the voltage-controlled oscillator in the feedback signal path. This circuit provides a VCO frequency that is exactly "n" times the input frequency. The variable "n" is programmed so that the phase-locked loop adjusts to synchronize a selected one of a number different possible input signals.

Another variation is to use a divide-by-n circuit following the voltage-controlled oscillator in the feedback signal path to the phase detector and a divide-by-m circuit in the path from the input signal to the other phase detector input.

A problem common to each of the above phase-locked loops is the need for the loop to minimize the phase difference quickly from start-up. For example, a slow lock-in process can cause significant interference and lack of intelligibility in both directions of communication. For battery-saving applications, such as cordless telephones, a slow lock-in process is also undesirable because the control circuitry for the cordless unit needs to shut down power from time to time to lessen the battery drain. When power to the phase-locked look resumes after power shutdown, it is important that the synchronization be reestablished as soon as possible. For such applications, a phase-locked loop with fast lock-in from start-up permits more frequent power shutdowns for increased battery savings.

SUMMARY OF THE INVENTION

One embodiment of the present invention is directed to an arrangement for phase-locking to an incoming signal. The arrangement includes a first divider circuit, a frequency-controllable oscillator, a second divider circuit and a phase detection circuit. The first divider circuit responds to the incoming signal and provides a reference signal by dividing by m during a phase-lock initiation stage and by dividing by n thereafter. The frequency-controllable oscillator provides an output signal having a frequency that is synchronized to the incoming signal when the arrangement is phase-locked to the incoming signal. The second divider circuit responds to the output signal and provides a feedback signal by dividing by x during a phase-lock initiation stage and by dividing by y thereafter. The phase detection circuit responds to the first and second divider circuits and controls the frequency-controllable oscillator so that the frequency of the output signal is synchronized to the incoming signal. In a more specific embodiment, each of the first and second divider circuits includes a switch for selecting the divide-by provision, with the switch being arranged to select the provision as a function of the phase detection circuit.

Another aspect of the present invention is directed to a method for phase-locking to an incoming signal. The method comprises dividing the incoming signal to provide a reference signal by dividing by m during a phase-lock initiation stage and by dividing by n thereafter, providing an output signal having a frequency that is synchronized to the incoming signal when the arrangement is phase-locked to the incoming signal, providing a feedback signal by dividing the output signal by x during a phase-lock initiation stage and by y thereafter, and detecting a phase difference between the feedback and reference signals and controlling the frequency-controllable oscillator so that the frequency of the output signal is synchronized to the incoming signal.

In yet another specific embodiment, the present invention is directed to phase-locking to an incoming signal involving first and second counter/switch arrangements. The first such arrangement is responsive to the incoming signal and provides a reference signal by dividing by m during a phase-lock initiation stage and by dividing by n thereafter. A voltage-controlled oscillator provides an output signal having a frequency that is synchronized to the incoming signal when the arrangement is phase-locked to the incoming signal. The second of the two counter/switch arrangements is responsive to the output signal and provides a feedback signal by dividing by x during a phase-lock initiation stage and by dividing by y thereafter. A phase detector receives the feedback and reference signals and detects a phase difference therebetween. The voltage controlled oscillator is responsive to the phase detector. A counter, responsive to the phase detector, terminates the phase-lock initiation stage by commanding the first switch to select the divide by n and the second switch to select the divide by y.

Other aspects of the present invention are directed to variations of the above embodiments.

The above summary of the present invention is not intended to describe each disclosed embodiment of the present invention. This is the purpose of the figures and of the detailed description that follows.

BRIEF DESCRIPTION OF THE DRAWINGS

Other aspects and advantages of the present invention will become apparent upon reading the following detailed description and upon reference to the drawings in which.

Figure 1:
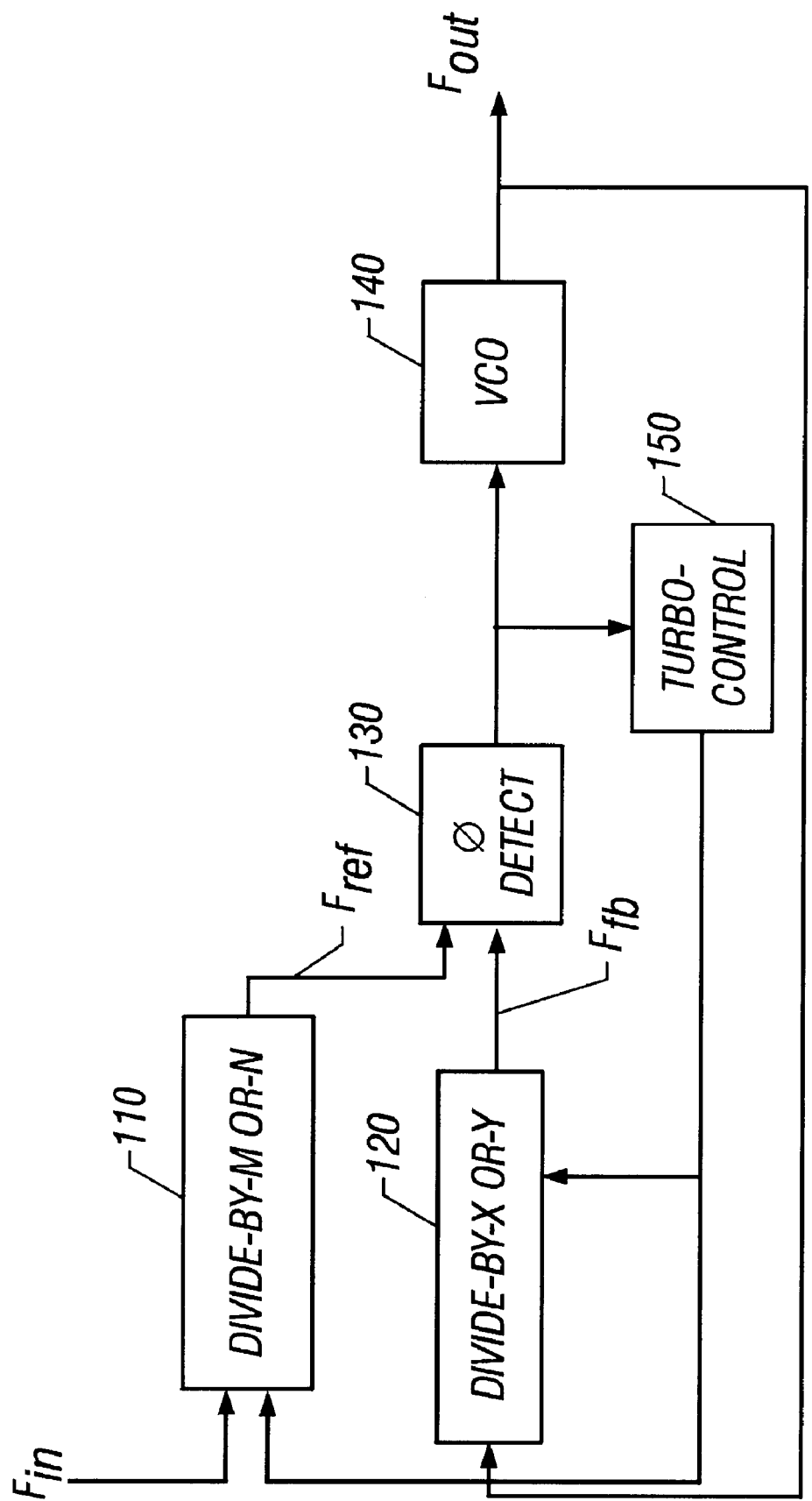
FIG. 1 is a block diagram of a phase-locked loop arrangement, according to a general embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is generally applicable to communication environments requiring synchronization between first and second signals. The present invention has been found to be particularly advantageous for wireless communication systems, such wireless telephones and the like, in which the fast-acting synchronization and/or battery-save operations are frequent. In accordance with the present invention, exemplary implementations of a phase-locked loop arrangement for such an environment are used in the discussion that follows.

Referring now to the drawings, FIG. 1 generally illustrates an arrangement for providing an output signal having frequency $F_{out}$ that is phase-locked to an incoming signal having frequency $F_{in}$. The arrangement of FIG. 1 includes two divider circuits 110 and 120, a phase detector 130, a voltage controlled oscillator 140 and a control circuit 150. The first divider circuit 110 responds to the incoming signal by providing a reference signal having a frequency $F_{ref}$. This frequency $F_{ref}$ is a result of the first divider 110 dividing the incoming signal by "m" during a phase-lock initiation stage and by dividing by "n" thereafter. The voltage-controlled oscillator 140 provides an output signal having a frequency that is synchronized to the incoming signal when the arrangement is phase-locked to the incoming signal. The second divider 120 responds to the output signal and provides a feedback signal by dividing by "x" during a phase-lock initiation stage and by dividing by "y" thereafter. The phase detector 130 responds to the first and second dividers 110 and 120 by controlling the voltage-controlled oscillator 140 so that the frequency of the output signal is synchronized to the incoming signal. In one embodiment, at least one of "m" and "x" are not equal to one. In one embodiment, "m" is less than "n" and "x" is less than "y". In another embodiment, "x" is greater than "m" and "y" is greater than "n".

The control circuit 150 is used to monitor the effect of the phase detector 130 on the voltage controlled oscillator 140. Beginning at start-up and at which time the phase-lock initiates, after a few (3 or 4) pulses commanding the voltage-controlled oscillator in a unilateral direction (increase or decrease), the control circuit disables the phase-lock initiation, or "turbo" fast-lock, mode. This is accomplished by signalling to the first and second dividers 110 and 120, and instructing them to use their alternative divide-by operations. In this manner, the voltage-controlled oscillator 140 runs a coarse adjustment mode for a few seconds and then reverts to normal steady-state operation, where the output signal and the incoming signal are substantially phase locked.

Figure 2A:
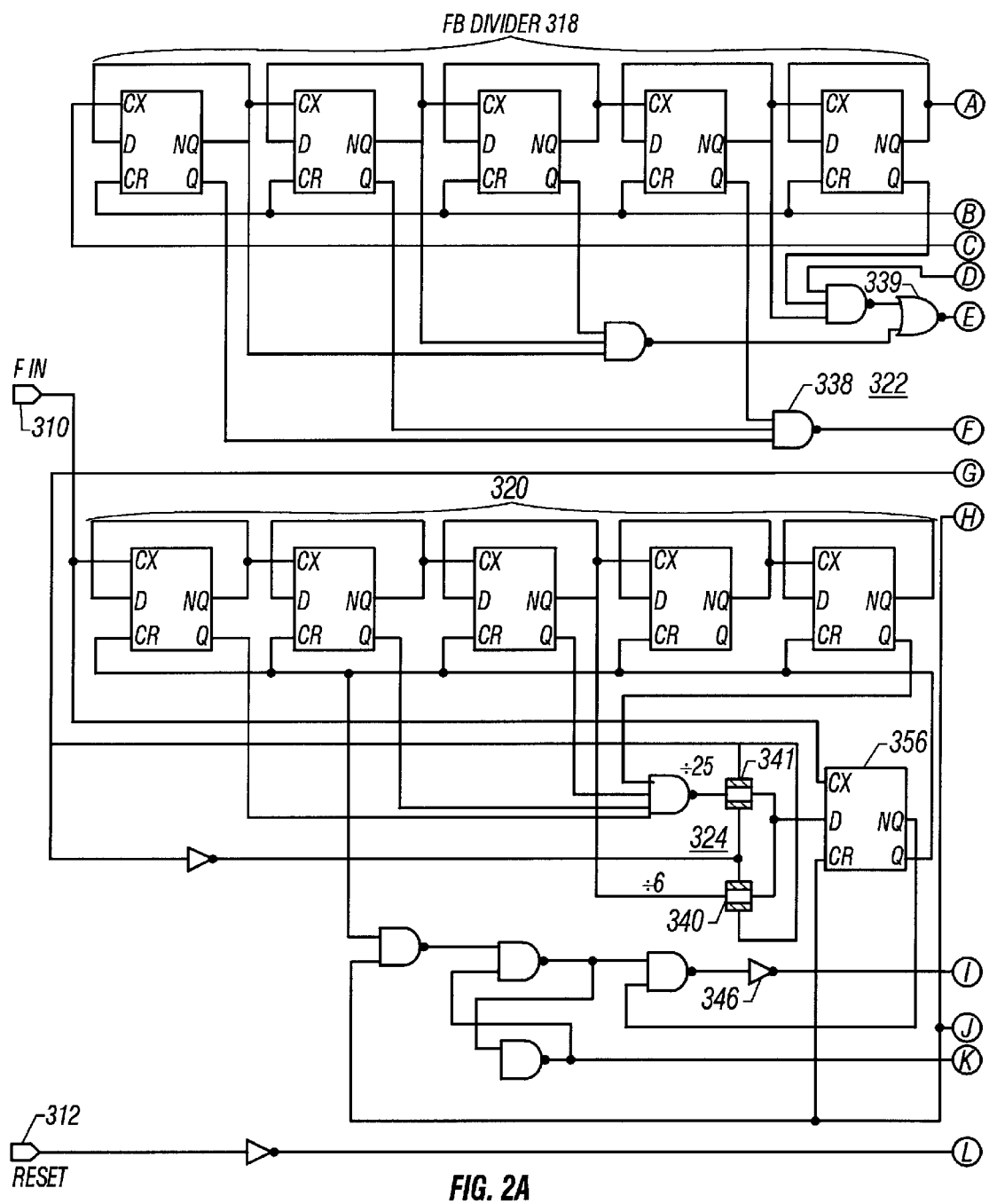
FIG. 2 is another, more detailed, embodiment of a phase-locked loop arrangement, according to the present invention.
Figure 2B:
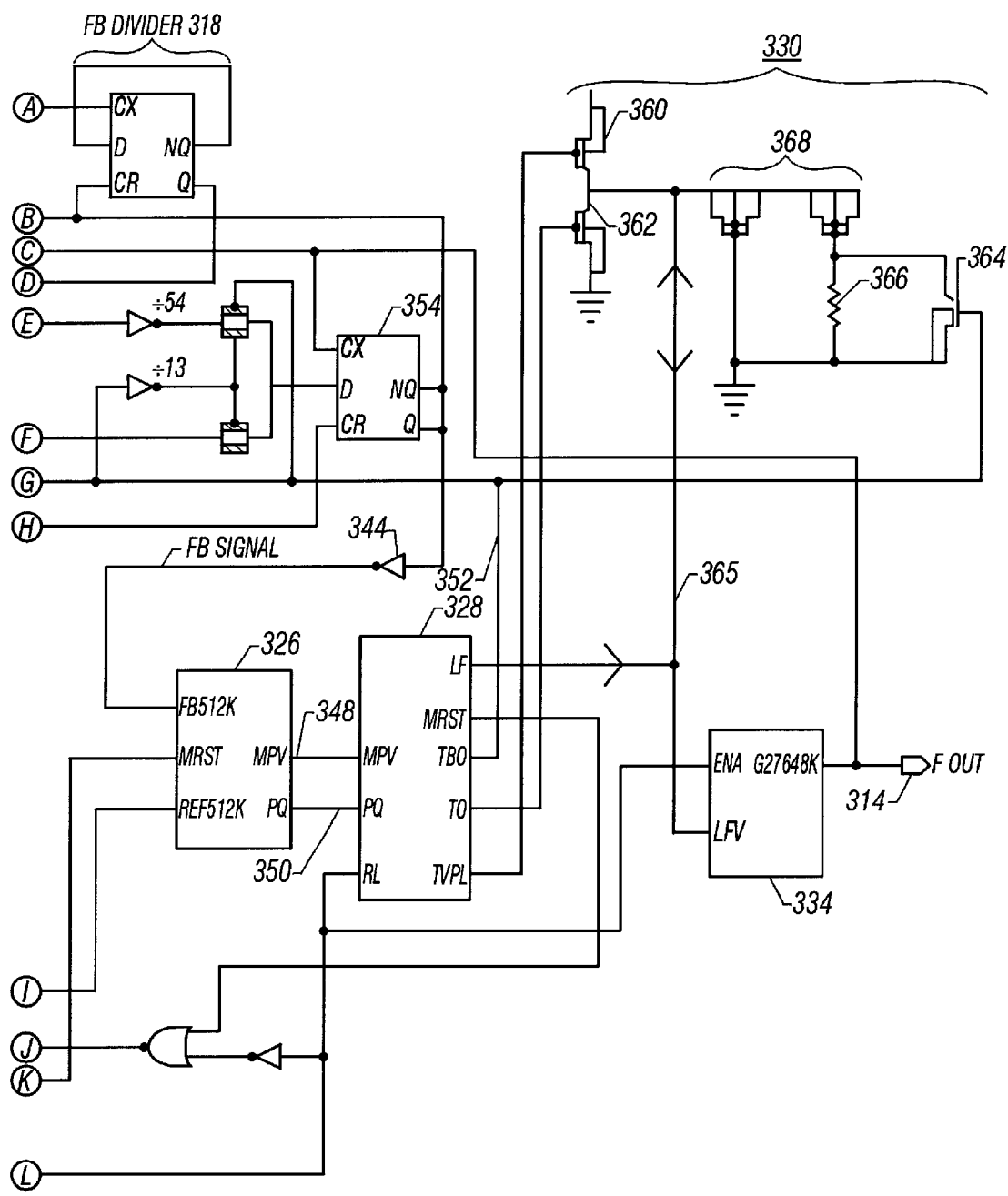

FIG. 2 illustrates a more specific example embodiment in accordance with the present invention. The circuit of FIG. 2 includes a terminal 310 receiving an input signal ($F_{IN}$), a terminal 312 receiving a reset signal, e.g., from a central processor or microcomputer, and an output terminal 314 providing an output signal ($F_{out}$) of the phase-locked loop.

The signal $F_{IN}$ is used as the reference signal to which the phase-locked loop circuit of FIG. 2 synchronizes. The reset signal, and associated circuitry, are optional. The output signal $F_{OUT}$ relates to the input signal $F_{IN}$ substantially as described in connection with FIG. 1.

The phase-locked loop circuit of FIG. 2 includes a feedback divider 318, a reference signal divider 320, a feedback division select circuit 322, a reference signal division select circuit 324, a phase detector 326, a turbo control circuit 328, a signal smoothing circuit 330, and a voltage-controlled oscillator (VCO) 334. The dividers 318 and 320 are implemented using D-latches to divide the respective input signals by 54 and by 25, respectively. Outputs from individual ones of the D-latches of each divider 318 and 320 are processed to provide alternative division schemes. For the divider 318, the outputs are processed to provide a divide-by-13 function (at the output of a NAND gate 338) or a divide-by-54 function (at the output of a NOR gate 339). For the divider 320, the outputs are processed to provide a divide-by-6 function (at the input of a transmission gate 340) or a divide-by-25 function (at the input of a transmission gate 341). During the start-up (or turbo) mode for the phase-locked loop circuit of FIG. 2, the divider 318 is used to provide the divide-by-13 function and the divider 320 is used to provide the divide-by-6 function.

The turbo controller 328 is arranged to count up to a designated count, for example, a few to several counts, such that when this number of counts in the same direction is directed, the controller 328 instructs the select circuits 322 and 324 to switch from their initial turbo mode (providing count functions of divide-by-13 and divide-by-6, respectively) to a steady state mode in which the divider 318 is used to provide a divide-by-54 function and the divider 320 is used to provide a divide-by-25 function.

The phase detector 326 is arranged to detect whether the falling edge of the input (or reference) signal falls earlier than a signal fed back from the VCO 334. Thus, the phase detector 326 receives a feedback signal from the output of an inverter 344 and compares the phase of this feedback signal to the phase of a reference signal provided by an inverter 346. More specifically, if the reference signal provided by the inverter 346 falls before the feedback signal is provided by the inverter 344, the phase detector 326 detects that the output signal provided at terminal 314 is too slow and, therefore, generates a "pump-up" signal at line 348. If the phase detector 326 detects that the reference signal is falling after the feedback signal, as provided by inverters 346 and 344, respectively, the phase detector 326 generates a "pump-down" signal at line 350. These pump-up and pump-down signals are the signals that are counted by the turbo controller 328, as discussed above.

The turbo controller 328 controls the select circuits 322 and 324 using an output signal provided at line 352. The turbo controller 328 is initialized such that the transmission gates associated with selector circuits 322 and 324 pass the division function associated with only one of the turbo and steady state modes. A D-latch 354 latches the output provided by the transmission gates associated with the selector circuit 322. The output of the D-latch 354, via the inverter 344, provides the feedback signal to the phase detector 326. Similarly, a D-latch 356 latches the divide-by-25 or the divide-by-6 count, which is then used to generate the reference signal for the phase detector 326.

The circuit 330 includes three inputs and one input/output. A PMOS (transistor) gate 360 receives a signal from the turbo controller 328 that activates the transistor 360 when the VCO is commanded to increase the output frequency. An NMOS (transistor) gate 362 receives another signal from the turbo controller 328 when the VCO is to decrease the output frequency of the VCO 334. The gates 360 and 362 are disabled during steady-state operation. The third input to the circuit 330 is also provided by the turbo controller 328. This signal is the same signal that is provided on line 352, indicating when the turbo mode is active. An NMOS transistor 364 receives this signal on line 352 to short-circuit a resistor 366 and thereby disable the signal-dampening effect of an RC circuit 368.

The RC circuit 368 is used for signal smoothing in conjunction with the input/output signal. In transitioning from the turbo to the steady-state mode of operation, the input to the VCO 334 is provided by the loop filter output at line 365, as generated from a conventional charge pump (within the controller 328). The RC circuit 368 is active in the steady-state mode and dampens the loop filter output, thereby inhibiting fast fluctuations at the VCO input.

An implementation according to the present invention, as described above, is advantageous in that the voltage provided at the input of a VCO is stabilized at least eight times faster using the above-characterized turbo mode of operation than when using a conventional phase-locked loop circuit implemented without-the turbo mode of operation.

Accordingly, the present invention provides, among other aspects, an arrangement and method for phase-locking to an incoming signal with a fast start-up mode. Other aspects and embodiments of the present invention will be apparent to those skilled in the art from consideration of the specification and practice of the invention disclosed herein. It is intended that the specification and illustrated embodiments be considered as exemplary only, with a true scope and spirit of the invention being indicated by the following claims.

What is claimed is:

1. An apparatus, comprising:
   a first divider circuit adapted to receive an incoming signal and generate a reference signal, the reference signal being generated by dividing the incoming signal by m during a phase-lock initiation mode and dividing the incoming signal by n for a steady-state time period following the phase-lock initiation mode;
   a voltage-controlled oscillator adapted to provide an output signal;
   a second divider circuit adapted to receive the output signal and generate a feedback signal, the feedback signal being generated by dividing the output signal by x during the phase-lock initiation mode and dividing the output signal by y for a steady-state time period after the phase-lock initiation mode; and
   a phase detection circuit adapted to detect a phase difference between the reference signal and the feedback signal and to control the voltage-controlled oscillator so that the frequency of the output signal is substantially synchronized to the incoming signal.

2. The apparatus of claim 1, further comprising:
   a control circuit adapted to disable the phase-lock initiation mode and to signal the first divider circuit to divide the incoming signal by n and the second divider circuit to divide the output signal by y for the steady-state time period.

3. The apparatus of claim 2, wherein the control circuit is further adapted to count signals generated by the phase detection circuit and to signal the first and second divider circuits upon a predetermined count.

4. The apparatus of claim 1, wherein the first divider circuit comprises a switch for dividing the incoming signal by either m or n.

5. The apparatus of claim 1, wherein the second divider circuit comprises a switch for dividing the output signal by either x or y.

6. The apparatus of claim 1, wherein m is less than n, and x is less than y.

7. The apparatus of claim 1, wherein x is greater than m, and y is greater than n.

8. An apparatus, comprising:
   a first divider circuit adapted to receive an incoming signal and generate a reference signal, the reference signal being generated by dividing the incoming signal by m during a phase-lock initiation mode and dividing the incoming signal by n for a steady-state time period following the phase-lock initiation mode;
   a voltage-controlled oscillator adapted to provide an output signal;
   a second divider circuit adapted to receive the output signal and generate a feedback signal, the feedback signal being generated by dividing the output signal by x during the phase-lock initiation mode and dividing the output signal by y for a steady-state time period after the phase-lock initiation mode;
   a phase detection circuit adapted to detect a phase difference between the reference signal and the feedback signal and to control the voltage-controlled oscillator so that the frequency of the output signal is substantially synchronized to the incoming signal; and
   a control circuit adapted to count signals generated by the phase detection circuit and to signal the first and second divider circuits to divide the incoming and output signals by n and y, respectively, for the steady-state time period upon a predetermined count.

9. A method, comprising:
   generating a reference signal by dividing an incoming signal by m during a phase-lock initiation mode and dividing the incoming signal by n for a steady-state time period following the phase-lock initiation mode;
   providing an output signal;
   generating a feedback signal by dividing the output signal by x during the phase-lock initiation mode and dividing the output signal by y for a steady-state time period after the phase-lock initiation mode;
   detecting a phase difference between the reference signal and the feedback signal; and
   controlling the voltage-controlled oscillator so that the frequency of the output signal is substantially synchronized to the incoming signal.

* * * * *